US012701951B2

(12) United States Patent
Shudo

(10) Patent No.: US 12,701,951 B2
(45) Date of Patent: Aug. 4, 2026

(54) SUBSTRATE PROCESSING METHOD AND SUBSTRATE PROCESSING APPARATUS

(71) Applicant: CANON KABUSHIKI KAISHA, Tokyo (JP)

(72) Inventor: Shinichi Shudo, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 852 days.

(21) Appl. No.: 18/058,195

(22) Filed: Nov. 22, 2022

(65) Prior Publication Data

US 2023/0170230 A1    Jun. 1, 2023

(30) Foreign Application Priority Data

Nov. 29, 2021    (JP) ................................. 2021-193341

(51) Int. Cl.
H01L 21/67        (2006.01)
H10P 72/00        (2026.01)
(52) U.S. Cl.
CPC ...... H10P 72/0432 (2026.01); H10P 72/0434 (2026.01); H10P 72/0602 (2026.01)
(58) Field of Classification Search
CPC ......... H01L 21/67098; H01L 21/67109; H01L 21/67248; H01L 21/67103; H05B 3/0047; H05B 3/10; H05B 3/14; H05B 3/141; H05B 3/143; H05B 3/20; H05B 3/22; H05B 3/265; H05B 3/283; H05B 2213/07
See application file for complete search history.

(56) References Cited

U.S. PATENT DOCUMENTS

| | | | | |
|---|---|---|---|---|
| 2005/0235918 A1* | 10/2005 | Kojima | ................. | C23C 16/463 |
| | | | | 118/733 |
| 2013/0248509 A1* | 9/2013 | Unno | ................ | H01L 21/67103 |
| | | | | 219/521 |
| 2020/0033308 A1* | 1/2020 | Kotsugai | ........... | H01L 21/67393 |
| 2023/0123710 A1* | 4/2023 | Yoon | .................... | G01N 21/956 |
| | | | | 356/237.2 |

FOREIGN PATENT DOCUMENTS

| | | | | |
|---|---|---|---|---|
| JP | 2000272985 A | | 10/2000 |
| JP | 2001174158 A | * | 6/2001 |
| JP | 2004336076 A | | 11/2004 |
| KR | 20130076828 A | | 7/2013 |
| KR | 20150035124 A | | 4/2015 |
| KR | 20210054104 A | | 5/2021 |

* cited by examiner

*Primary Examiner* — Justin C Dodson
(74) *Attorney, Agent, or Firm* — Canon U.S.A., Inc. IP Division

(57)        ABSTRACT

A processing method for a substrate processing apparatus including a chamber in which a heating plate configured to heat a substrate placed on the heating plate is located including heating the heating plate to a first temperature, cooling the heating plate to a second temperature from the first temperature, supplying dry gas into the chamber during the heating and the cooling, and carrying in the substrate onto the heating plate after the cooling.

13 Claims, 9 Drawing Sheets

100

101

SUBSTRATE PROCESSING METHOD AND SUBSTRATE PROCESSING APPARATUS

BACKGROUND OF THE INVENTION

Field of the Invention

The present disclosure relates to a substrate processing method and a substrate processing apparatus.

Description of the Related Art

In a photoresist processing step in manufacturing a semiconductor device, a resist is coated on a substrate and then various heating processes are performed thereon to heat and dry the resist. The heating processes are performed in a state where the substrate to be heated is placed on a heating plate called a hot plate, or in a state where the substrate is located near the hot plate. Aluminum nitride (AIN) can be used as a material of the hot plate. If the hot plate made of aluminum nitride is used, the plate material is high in heat conductivity and can be made thin because of its high strength. Therefore, the hot plate made of aluminum nitride can be rapidly heated or cooled compared to the conventional ones. Japanese Patent Application Laid-Open No. 2004-336076 discusses a technique for a heat processing apparatus to heat a substrate.

If a hot plate made of aluminum nitride is used in the heat processing apparatus discussed in Japanese Patent Application Laid-Open No. 2004-336076, the hot plate can react with moisture in the air depending on the heating temperature, which can generate outgas containing ammonia.

Japanese Patent Application Laid-Open No. 2000-272985 discusses a technique for carrying out a baking process to apply an oxide film to the surface of a hot plate constituted by an aluminum nitride sintered body so as to enhance the resistance to water of the aluminum nitride sintered body.

However, if the sintered body is used as the hot plate, machining is inevitably required after the baking step, so that the oxide film on the sintered body is partially scraped off. Specifically, even if the sintered body discussed in Japanese Patent Application Laid-Open No. 2000-272985 is incorporated into an apparatus as a hot plate and a substrate heating process is performed in the apparatus, outgas can be generated from a portion of the sintered body where the oxide film is scraped off.

SUMMARY OF THE INVENTION

The present disclosure is directed to providing a processing method for preventing outgas from being generated from a heating plate when a substrate is heated.

According to an aspect of the present disclosure, a processing method for a substrate processing apparatus including a chamber in which a heating plate configured to heat a substrate placed on the heating plate is located including heating the heating plate to a first temperature, cooling the heating plate to a second temperature from the first temperature, supplying dry gas into the chamber during the heating and the cooling, and carrying in the substrate onto the heating plate after the cooling.

Further features of the present disclosure will become apparent from the following description of exemplary embodiments with reference to the attached drawings.

DESCRIPTION OF THE EMBODIMENTS

Exemplary embodiments of the present disclosure will be described in detail below with reference to the accompanying drawings.

Figure 1:
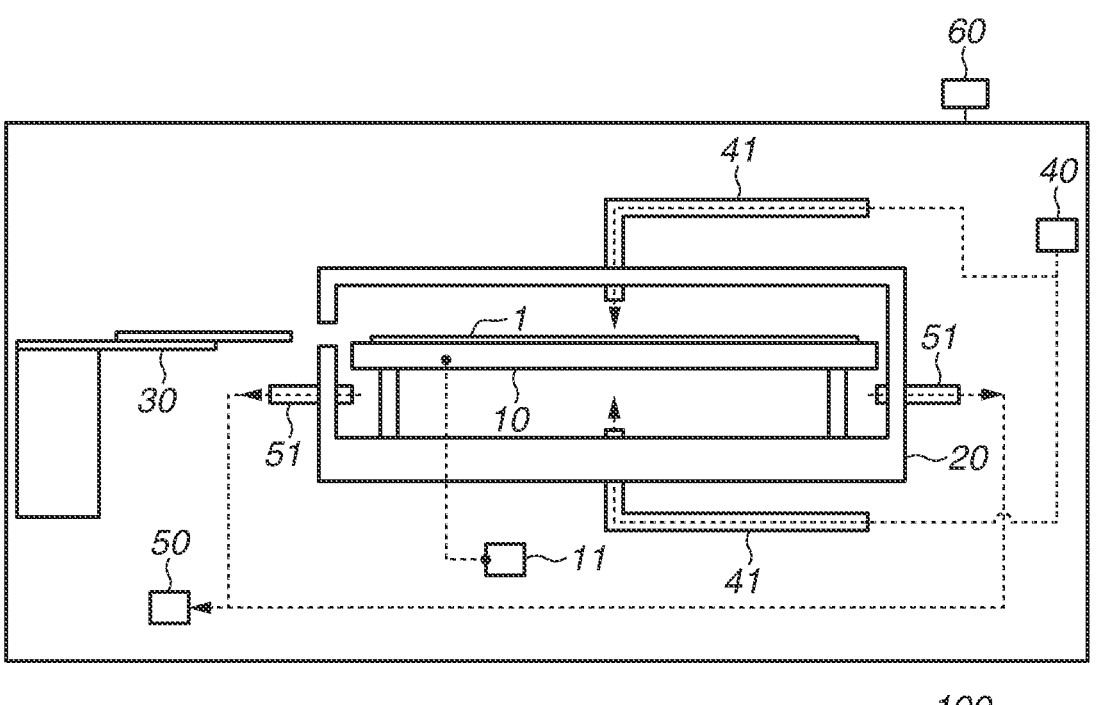
FIG. 1 illustrates a substrate processing apparatus according to a first exemplary embodiment.

FIG. 1 illustrates a substrate processing apparatus 100 according to a first exemplary embodiment of the present disclosure. The substrate processing apparatus 100 includes a heating plate 10 that holds the substrate 1 and heats the substrate 1, a chamber 20 that is arranged to surround the heating plate 10, and a substrate conveyance unit 30. The substrate 1 may be a bare silicon wafer or a glass substrate. A resin material to be coated on the substrate 1 is coated by using a coater developer or the like. The substrate processing apparatus 100 also includes a control unit 60 that controls a substrate processing operation to be described below.

The substrate 1 may be heated in a state where the substrate 1 is placed on the heating plate 10, or in a state where the substrate 1 is located near the heating plate 10.

The heating plate 10 may hold the substrate 1 using a plurality of adsorption pins provided on the heating plate 10, or may directly hold the substrate 1 by sucking the substrate 1 from the heating plate 10 by vacuum suction. Each adsorption pin may include a lifting mechanism and may be used when the substrate 1 is carried in onto the heating plate 10 or is carried out from the heating plate 10. The heating plate 10 may hold the substrate 1 by an electrostatic method, instead of using the vacuum suction method.

The heating plate 10 desirably has high heat conductivity in terms of rapid heating and cooling. For example, the heating plate 10 may desirably have heat conductivity of 150 W/m·K or more. It is desirable to use a hot plate containing aluminum nitride as a material of the heating plate 10. The heating plate 10 may have a stacked structure including a glass substrate, a heating element, and aluminum nitride as a base material. The heating plate 10 includes a power supply unit 11 and is configured to heat the heating element with power supplied from the power supply unit 11, thereby heating the heating plate.

The chamber 20 is arranged to surround the heating plate 10. The chamber 20 may include a lift mechanism that allows the substrate 1 to carry in, and may be separated into upper and lower portions. The chamber 20 may be provided with a limited opening to carry in and carry out the substrate 1 therethrough, and provide a separated space for the heating plate therein. The chamber 20 may also be provided with a shutter to close the opening. It is desirable to form a closed space in the chamber 20 during heating of the heating plate 10.

It is also desirable to maintain the atmosphere within the chamber 20 even when the substrate 1 is carried in onto the heating plate 10 and is carried out from the heating plate 10.

The opening of the chamber 20 used to carry in the substrate 1 onto the heating plate 10 and carry out the substrate 1 from the heating plate 10 is desirably as small as possible, and the carry-in and carry-out of the substrate 1 is desirably executed in a short period of time.

The substrate conveyance unit 30 includes an articulated robot and is configured to convey the substrate 1 into the chamber 20 by adsorbing and holding the substrate 1 by use of a hand of the articulated robot. The substrate processing apparatus 100 further includes a gas supply unit 40, a gas supply pipe portion 41, an exhaust unit 50, and an exhaust pipe portion 51.

The gas supply pipe portion 41 is located on the chamber 20. If the gas supply pipe portion 41 is provided on the upper portion of the chamber 20 which is located above the substrate 1, gas supplied from the gas supply pipe portion 41 to the substrate 1 can prevent foreign material from adhering to the substrate 1. If a structure including aluminum nitride is used as the heating plate 10, the structure can react with moisture in the air depending on the heating temperature, which can generate outgas containing ammonia.

Outgas such as siloxane can be generated depending on the member used in the structure. A temperature at which outgas is generated varies depending on the storage state, use environment, and use frequency of the heating plate 10. A noticeable amount of outgas can be generated at a temperature ranging from 250° C. to 300° C. For this reason, the gas supply pipe portion 41 is provided on the lower portion of the chamber 20 which is located below the heating plate 10, and gas supplied from the gas supply pipe portion 41 to the heating plate 10 dries the surrounding environment of the heating plate 10, thereby preventing the generation of outgas.

The gas supply pipe portion 41 may be located so that gas can be supplied to a side surface of the heating plate 10. Gas supplied from the gas supply unit 40 and the gas supply pipe portion 41 is desirably clean dry air or dry gas such as nitrogen ($N_2$) gas or inert gas.

The exhaust pipe portion 51 is located on the chamber and is configured to exhaust air from the space surrounded by the chamber 20. The exhaust pipe portion 51 is desirably located below the substrate 1 so as to prevent gas components released from the heating plate 10 during heating of the heating plate 10 from adhering to the substrate 1.

Figure 2A:
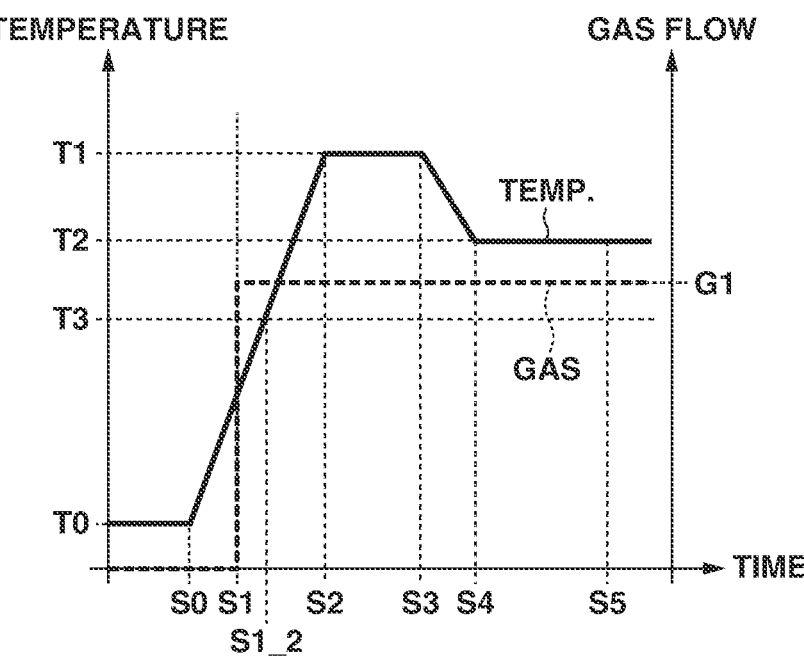
FIGS. 2A and 2B illustrate steps performed in the substrate processing apparatus according to the first exemplary embodiment.
Figure 2B:
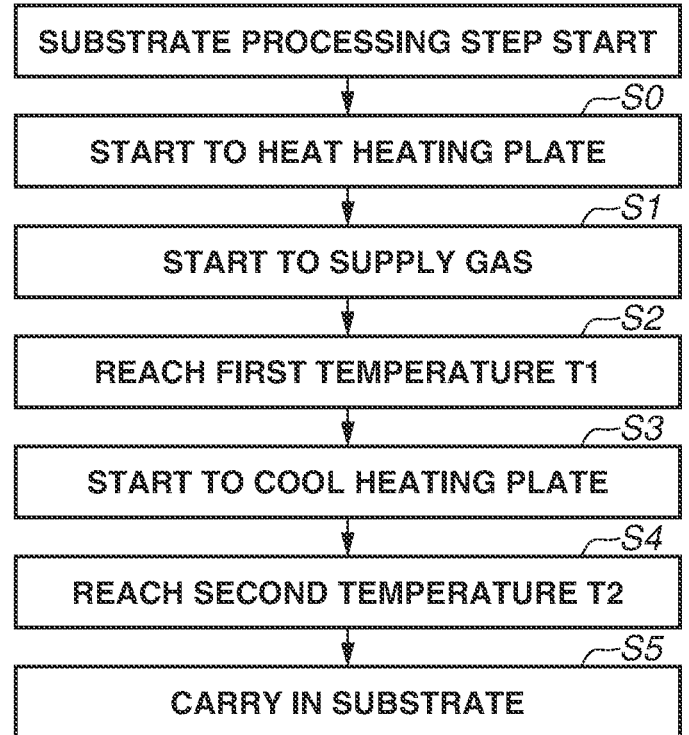

FIGS. 2A and 2B illustrate steps from start of each substrate processing step until the substrate 1 is carried in onto the heating plate 10 in the substrate processing apparatus 100. FIG. 2A is a graph illustrating a relationship between a temperature (Temp.) and an amount of dry gas (Gas.) to be supplied during a heating step for the heating plate 10 and a gas supply step for the gas supply unit 40. FIG. 2B is a flowchart illustrating steps from the step of starting to heat the heating plate 10 until the step of carrying in the substrate 1 onto the heating plate 10.

The substrate processing apparatus 100 starts to heat the heating plate 10 at time S0 and heats the heating plate 10 such that the temperature of the heating plate 10 rises from an initial temperature T0 to a first temperature T1 until time S2. The first temperature T1 is a temperature higher than a second temperature T2 that is a heating temperature for heating the substrate 1. The first temperature T1 is desirably set to 250° C. or higher so as to eliminate impurities including moisture on the heating plate 10.

The heating plate 10 is continuously heated at the first temperature T1 during a period from time S2 to time S3. This process up to here is a first step. After completion of the first step, the substrate processing apparatus 100 cools the heating plate 10 to lower the temperature of the heating plate 10 to the second temperature T2. This process is a second step.

After completion of the second step, the substrate processing apparatus 100 starts to carry in the substrate 1 at time S5 and places the substrate 1 on the heating plate 10 to start to heat the substrate 1. At time S1, the gas supply unit 40 supplies dry gas into the space surrounded by the chamber 20 through the gas supply pipe portion 41. At the same time, the exhaust unit 50 exhausts air from the space surrounded by the chamber 20 through the exhaust pipe portion 51. The supply of dry gas into the space surrounded by the chamber 20 may be started before at time S0 when heating of the heating plate 10 is started.

In the present exemplary embodiment, dry gas is supplied into the chamber 20 during the heating period in the first step and during the cooling period in the second step.

It is desirable to supply dry gas into the chamber 20 at least before the temperature of the heating plate 10 reaches the first temperature T1. Further, it is desirable to start the supply of dry gas before time S1_2 when the temperature of the heating plate 10 reaches a third temperature T3 at which outgas is generated from the heating plate 10. Exhausting air from the space surrounded by the chamber 20 is executed at the same timing. The amount of gas to be supplied from the gas supply unit 40 is desirably more than or equal to the amount of air to be exhausted by the exhaust unit 50 so as to prevent wet air from flowing into the chamber 20 from the outside through the opening of the chamber 20 or a gap.

Figure 3A:
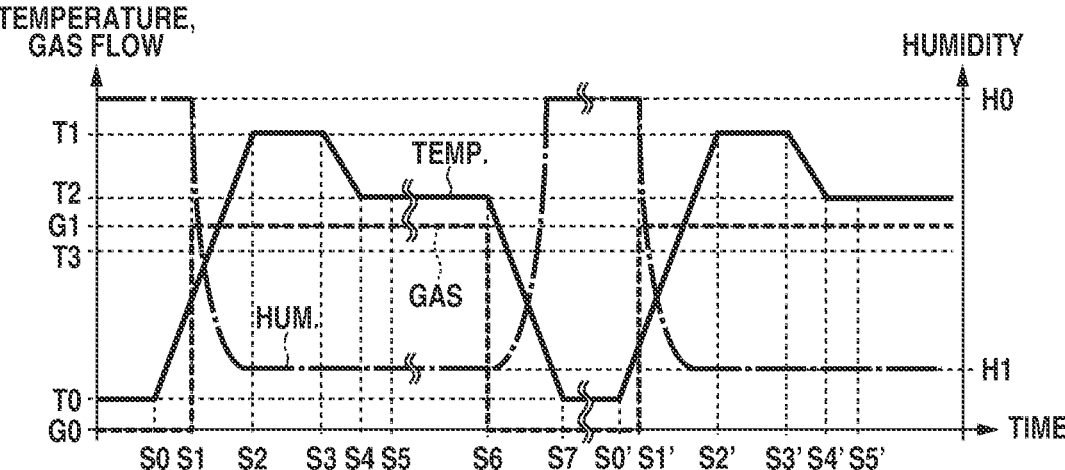
FIGS. 3A to 3C illustrate steps performed in the substrate processing apparatus according to the first exemplary embodiment.
Figure 3B:
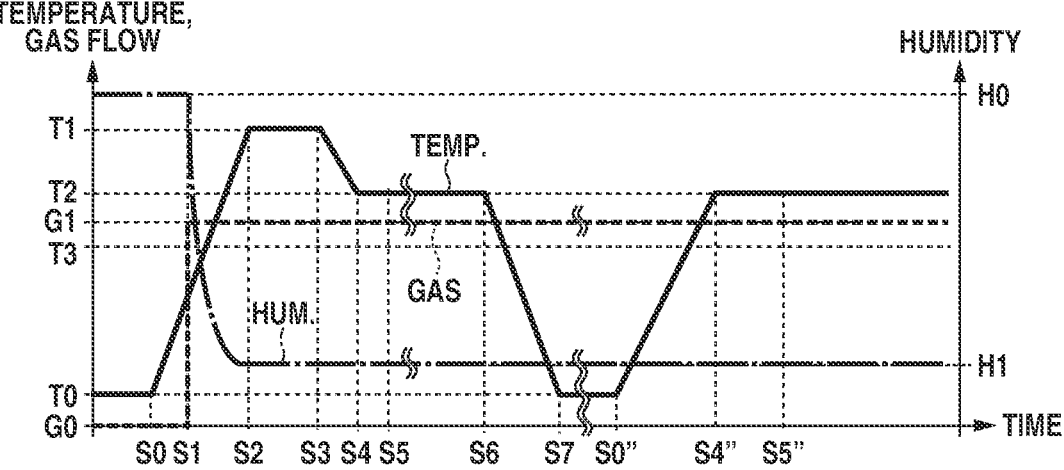
Figure 3C:
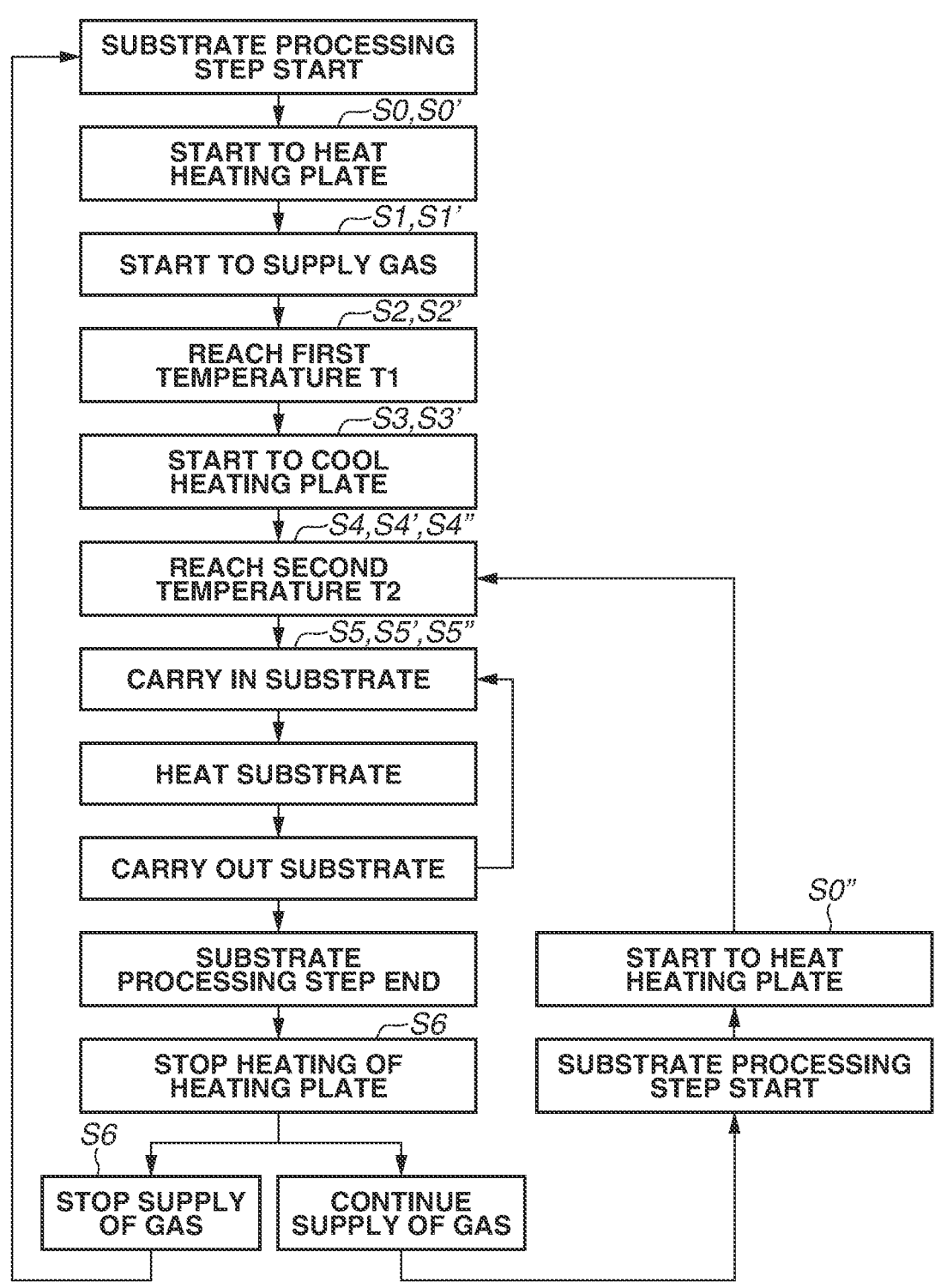

FIGS. 3A to 3C illustrate steps for processing a plurality of substrates in the substrate processing apparatus 100.

Similar to FIG. 2A, FIGS. 3A and 3B are graphs illustrating the relationship between the temperature and the amount of dry gas to be supplied during the heating step for heating the heating plate 10 and the gas supply step for supplying gas from the gas supply unit 40, and also illustrating humidity (Hum.) in the chamber 20. FIG. 3A illustrates a case where a plurality of substrates is processed and then heating of the heating plate 10 and supply of gas from the gas supply unit 40 are interrupted, and the substrate processing is performed again after a certain period of time where the apparatus is in an idle state.

FIG. 3B illustrates a case where a plurality of substrates is processed and then heating of the heating plate 10 is interrupted in a state where gas is continuously supplied from the gas supply unit 40, and the substrate processing is performed again after a certain period of time where the apparatus is in an idle state. FIG. 3C illustrates processing steps performed in the substrate processing apparatus 100. The processing from time S0 to time S5 is similar to that illustrated in FIG. 2A.

The substrate processing apparatus 100 continuously processes the plurality of substrates during a period from time S5 to time S6. In the case of continuously processing the plurality of substrates, when gas is continuously supplied into the chamber 20, the humidity in the chamber 20 is maintained at a low level (H1). Accordingly, the first step may be performed only immediately before a first substrate is carried in, and needs not be performed on the second and subsequent substrates.

After completion of continuous processing on the plurality of substrates, heating of the heating plate 10 is finished. After heating of the heating plate 10 is finished, the temperature of the heating plate 10 is lowered to the initial temperature T0. In this case, if the supply of dry gas into the chamber 20 is also stopped, the humidity in the chamber 20 is increased to humidity H0 that is equal to the humidity in the outside of the chamber 20. In the case of restarting the substrate processing after a certain period of time (apparatus waiting time) from time S7 to time S0' where the apparatus is in the idle state, the steps from time S0' to time S4', which are similar to the steps from time S0 to time S4, are to be performed again before the subsequent substrate is carried in.

However, if the substrate processing apparatus 100 has waited for a short time, the period from time S2' to time S3' in the first step may be shortened. As illustrated in FIG. 3B, when the substrate processing is restarted in the case where gas is continuously supplied into the chamber 20 after heating of the heating plate 10 is interrupted at time S6, the first step may be omitted and the substrate 1 may be carried in after the temperature of the heating plate 10 reaches the second temperature T2. Further, the period for carrying out the first step may be set to be automatically changed depending on the waiting time of the substrate processing apparatus 100. For example, the period for carrying out the first step can be automatically changed depending on each case. Alternatively, a period during which the heating plate 10 is exposed to air containing moisture may be measured and the substrate processing apparatus 100 may be controlled to perform the first step again in a case where the heating plate 10 is exposed to the air for a certain period of time or longer.

Figure 4:
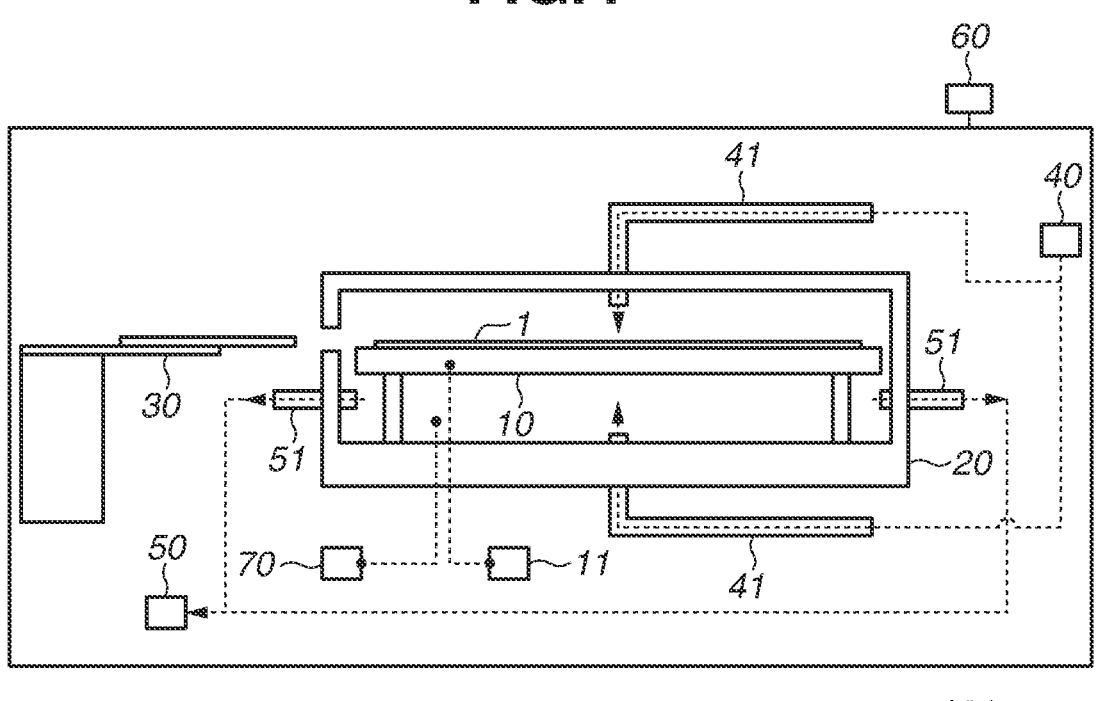
FIG. 4 illustrates a substrate processing apparatus according to a second exemplary embodiment.

FIG. 4 illustrates a substrate processing apparatus 101 according to a second exemplary embodiment of the present disclosure. The substrate processing apparatus 101 includes the components of the substrate processing apparatus 100 according to the first exemplary embodiment, and further includes a measurement monitoring unit 70 that measures and monitors the atmosphere near the heating plate 10.

The measurement monitoring unit 70 may be configured to suck the atmosphere near the heating plate 10 to measure the atmosphere. The heating plate 10 can generate outgas depending on the heating temperature. Therefore, a chromatography that sucks the atmosphere in the space to directly analyze gas, or a particle counter may be used. Additionally, a laser displacement meter, a spectral interferometer, or the like may be used to calculate a gas concentration based on a difference in distance from a reference point using the change in a refractive index caused by the outgas.

A hydrometer may also be used to measure the water content in the space. Like a dew-point meter, the hydrometer may be used to measure the dew-point temperature based on the water content, or may be used to measure an absolute humidity or a relative humidity.

Figure 5A:
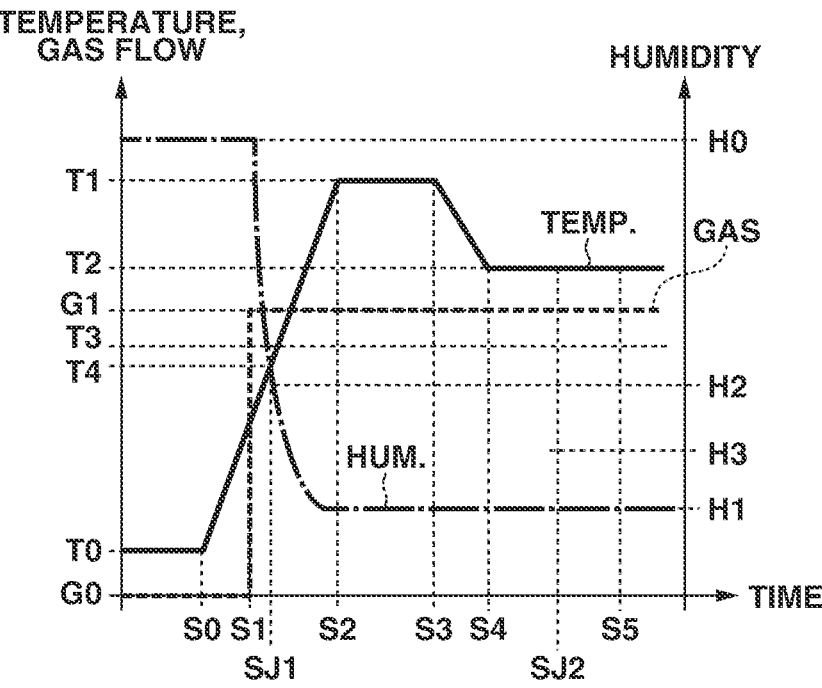
FIGS. 5A and 5B illustrate steps performed in the substrate processing apparatus according to the second exemplary embodiment.
Figure 5B:
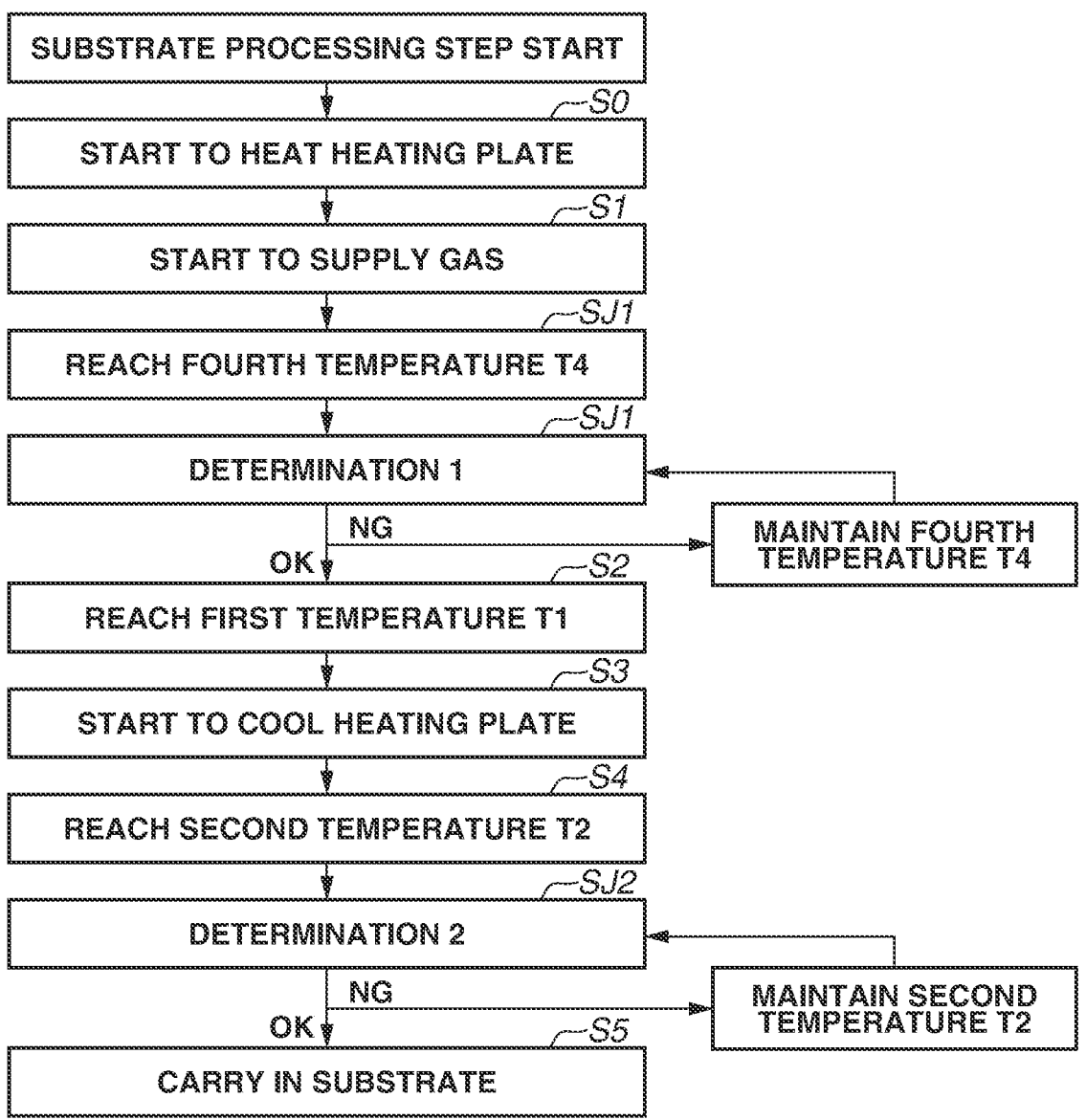

FIGS. 5A and 5B illustrate steps to be performed until the substrate 1 is carried in onto the heating plate 10 in the substrate processing apparatus 101. Similar to FIG. 3A, FIG. 5A illustrates the relationship between the temperature, the amount of dry gas to be supplied and the humidity (Hum.) in the chamber 20 in during the heating step for heating the heating plate 10 and the gas supply step for supplying gas from the gas supply unit 40. FIG. 5B illustrates steps from the start of heating of the heating plate 10 until the substrate 1 is carried in onto the heating plate 10.

The processing performed by the substrate processing apparatus 101 includes steps similar to the substrate processing steps performed in the substrate processing apparatus 100 according to the first exemplary embodiment, and further includes a determination 1 to determine whether to continue the processing at time SJ1 and a determination 2 to determine whether to continue the processing at time SJ2. The determination 1 is performed after time S1 when the supply of gas into the chamber 20 is started, and is performed at a temperature T4 before the temperature reaches the temperature T3 at which the heating plate 10 can generate outgas.

In this case, the measurement monitoring unit 70 measures the humidity in the chamber 20, and if the humidity in the chamber 20 is lower than reference humidity H2, it is determined that the processing may proceed to the subsequent step. On the other hand, if the humidity in the chamber 20 is higher than the reference humidity H2, the processing is interrupted until the humidity becomes lower than the reference humidity H2, and heating is performed to maintain the temperature of the heating plate 10 at the fourth temperature T4.

The determination 2 is performed after the temperature of the heating plate 10 reaches the second temperature T2. Like in the determination 1, the measurement monitoring unit 70 measures the humidity in the chamber 20, and if the measured humidity in the chamber 20 is lower than reference humidity H3, it is determined that the substrate 1 is allowed to be carried into the chamber 20 and the processing may proceed to the subsequent step. Thus, the step of carrying in the substrate 1 is performed.

On the other hand, if the humidity in the chamber 20 is higher than the reference humidity H2, the processing is interrupted until the humidity becomes lower than the reference humidity H3, and heating is performed to maintain the temperature of the heating plate 10 at the second temperature T2. In this case, one or both of the determination 1 and the determination 2 may be performed.

The determination 1 and the determination 2 may be performed using respective different measurement methods. In each determination, the humidity in the chamber 20 may be measured, and a chromatography, a particle counter, a laser displacement meter, a spectral interferometer, or the like may be used.

Figure 6A:
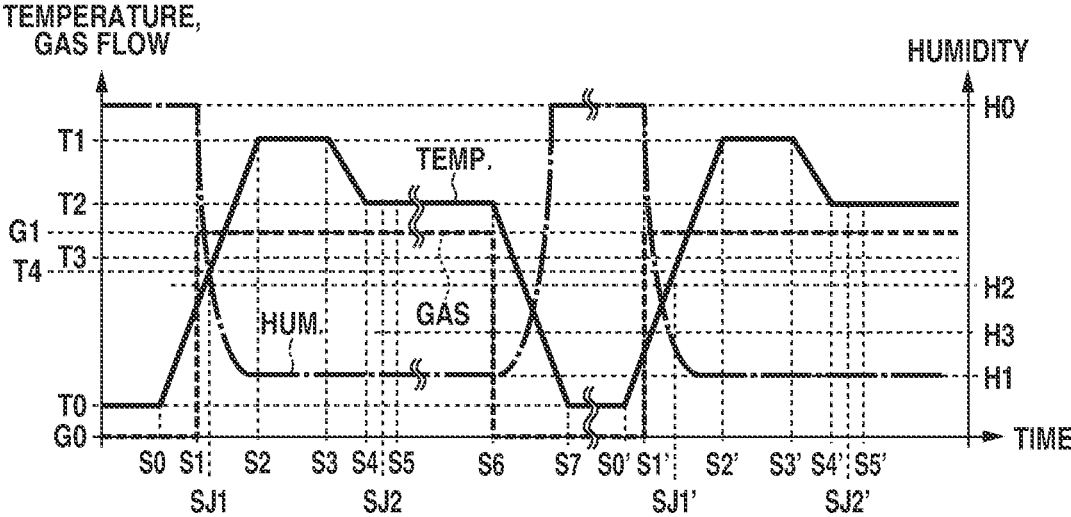
FIGS. 6A to 6C illustrate steps performed in the substrate processing apparatus according to the second exemplary embodiment.
Figure 6B:
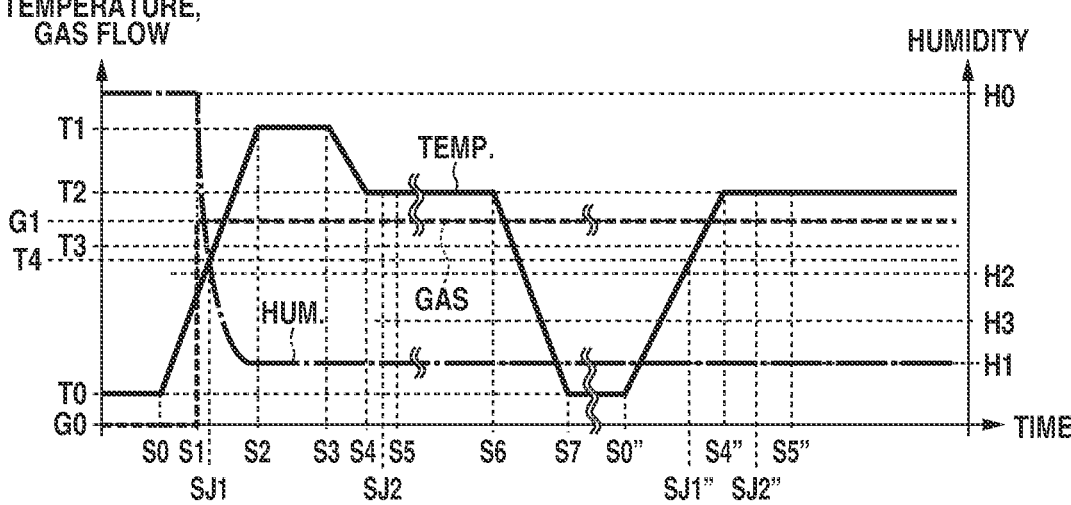
Figure 6C:
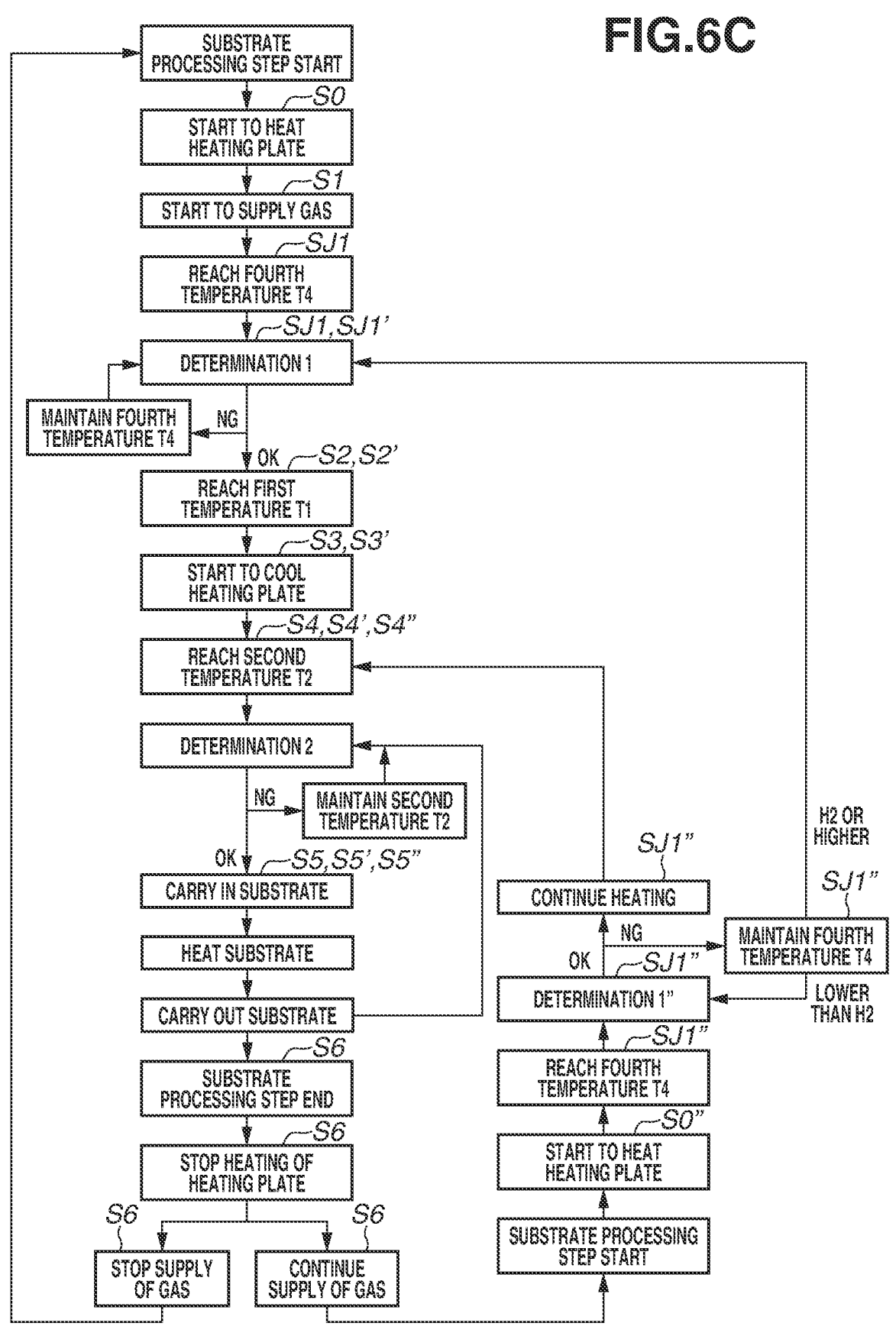

FIGS. 6A to 6C illustrate steps to be performed when a plurality of substrates is processed in the substrate processing apparatus 101.

FIGS. 6A and 6B are graphs each illustrating the relationship between the temperature, the amount of dry gas to be supplied and the humidity in the chamber 20 during the heating step for heating the heating plate 10 and the gas supply step for supplying gas from the gas supply unit 40. FIG. 6A illustrates a case where a plurality of substrates is processed and then heating of the heating plate 10 and supply of gas from the gas supply unit 40 are interrupted, and the substrate processing is performed again after a certain period of time where the apparatus is in the idle state.

FIG. 6B illustrates a case where a plurality of substrates is processed and then heating of the heating plate 10 is interrupted in a state where gas is continuously supplied from the gas supply unit 40, and the substrate processing is performed again after a certain period of time where the apparatus is in the idle state. FIG. 6C illustrates processing steps performed in the substrate processing apparatus 101. The processing performed by the substrate processing apparatus 101 includes the substrate processing steps performed in the substrate processing apparatus 100 illustrated in FIG. 3A, and further includes the determination 1, the determination 2, and a determination 1" to determine whether to continue the processing at times SJ1, SJ2, SJ1', SJ2', SJ1", and SJ2".

The determination 1 and the determination 2 at times SJ1 and SJ2 are respectively similar to the determination 1 and the determination 2 illustrated in FIGS. 5A and 5B. The substrate processing apparatus 101 continuously processes the plurality of substrates from time S5 to time S6. In the case of continuously processing the plurality of substrates, when dry gas is continuously supplied into the chamber 20, the humidity in the chamber 20 is maintained at a low level. Thus, the first step can be omitted to be performed on the second and subsequent substrates.

In an operation for carrying out the substrate 1, a part of the chamber 20 needs to be opened, and the humidity in the chamber 20 can increase depending on the size of the opening. Therefore, the determination 2 is performed again before a new substrate is carried in so as to check whether the humidity in the chamber 20 is maintained at humidity lower than the reference humidity H3.

If the humidity in the chamber 20 is lower than the reference humidity H3, the next subsequent substrate is carried in, and if the humidity in the chamber 20 is higher than or equal to the reference humidity H3, the processing is interrupted until the humidity becomes lower than the reference humidity H3, and heating is performed so as to maintain the temperature of the heating plate 10 at the second temperature T2. In this case, if the humidity in the chamber 20 exceeds the reference humidity H2, for example, due to some trouble in the substrate processing apparatus 101 when the substrate 1 is carried out, it is desirable to perform the processing again from the first step before the next subsequent substrate is carried in.

After completion of continuous processing on the plurality of substrates, if the substrate processing is restarted after the period from time S7 to time S0' where the apparatus is in the idle state, the determination 1 and the determination 2 are performed to determine whether the humidity is lower than the reference humidity H2 and the reference humidity H3. As illustrated in FIG. 6B, if gas is continuously supplied into the chamber 20 while the apparatus is in the idle state, the determination 1" is performed instead of the determination 1 after the temperature reaches the fourth temperature T4 at time SJ1". In this case, if the humidity in the chamber 20 is lower than the reference humidity H3, the first step is skipped and the processing proceeds to the determination 2 after the temperature reaches the second temperature T2.

If the humidity is higher than or equal to the reference humidity H3 and lower than the reference humidity H2, the temperature of the heating plate 10 is maintained at the fourth temperature T4. If the humidity is lower than the reference humidity H3, the first step is skipped and the processing proceeds to the determination 2 after the temperature reaches the second temperature T2. If the humidity is higher than or equal to the reference humidity H2, the temperature of the heating plate 10 is maintained at the fourth temperature T4 and the processing proceeds to the determination 1. If the humidity is lower than the reference humidity H2, the processing is performed from the first step. Like in the case illustrated in FIGS. 5A and 5B, each determination may be performed by using other measurement methods, other than the method using humidity.

While exemplary embodiments of the present disclosure have been described above, the present disclosure is not limited to the above-described exemplary embodiments. Various modifications and changes can be made within the scope of the disclosure.

According to an aspect of the present disclosure, it is possible to provide a processing method for preventing outgas from being generated from a heating plate when a substrate is heated.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-193341, filed Nov. 29, 2021, which is hereby incorporated by reference herein in its entirety.

What is claimed is:

1. A processing method for a substrate processing apparatus including a chamber in which a heating plate configured to heat a substrate to be placed on the heating plate is located, the processing method comprising:
    heating the heating plate to a first temperature;
    cooling the heating plate to a second temperature from the first temperature, the first temperature is higher than the second temperature;
    supplying dry gas into the chamber continuously during both the heating and the cooling, the supplying of the dry gas is started before the heating plate reaches a third temperature at which outgas is generated from the heating plate; and
    carrying in the substrate onto the heating plate after the cooling.

2. The processing method according to claim 1, wherein the substrate processing apparatus carries the substrate into the chamber in a state where the heating plate is heated to the second temperature.

3. The processing method according to claim 1, wherein in a case where a plurality of substrates is continuously processed, the heating is performed only before a first substrate is carried in.

4. The processing method according to claim 1, wherein the heating is performed again in a case where the heating plate is exposed to air containing moisture for a certain period of time or longer.

5. The processing method according to claim 1, wherein a period during which the heating is performed is changed depending on a waiting time of the substrate processing apparatus.

6. The processing method according to claim 1, wherein the first temperature is 250° C. or higher.

7. The processing method according to claim 1, wherein the heating plate has a structure including aluminum nitride.

8. The processing method according to claim 1, wherein the dry gas is sprayed onto the heating plate.

9. The processing method according to claim 1, wherein the dry gas is any one of clean dry air, nitrogen ($N_2$) gas, and inert gas.

10. The processing method according to claim 1, wherein the substrate processing apparatus further includes an exhaust unit configured to exhaust atmosphere within the chamber at least during the heating.

11. The processing method according to claim 1, wherein the substrate processing apparatus includes a measurement unit configured to measure atmosphere near the heating plate.

12. The processing method according to claim 11, wherein the substrate processing apparatus determines whether to carry the substrate into the chamber depending on a result of the measurement of the atmosphere near the heating plate.

13. The processing method according to claim 12, wherein the atmosphere near the heating plate is measured by using any one of a particle counter, a chromatography, a laser displacement meter, a spectral interferometer, and a hydrometer.

* * * * *